US011715680B2

(12) United States Patent
Jeong

(10) Patent No.: US 11,715,680 B2
(45) Date of Patent: Aug. 1, 2023

(54) PRINTED CIRCUIT BOARD

(71) Applicant: SAMSUNG ELECTRO-MECHANICS CO., LTD., Suwon-si (KR)

(72) Inventor: Koo Woong Jeong, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 240 days.

(21) Appl. No.: 17/189,766

(22) Filed: Mar. 2, 2021

(65) Prior Publication Data

US 2022/0199506 A1 Jun. 23, 2022

(30) Foreign Application Priority Data

Dec. 17, 2020 (KR) .......................... 10-2020-0177163

(51) Int. Cl.
*H05K 1/02* (2006.01)
*H01L 23/498* (2006.01)
(Continued)

(52) U.S. Cl.
CPC .... *H01L 23/49822* (2013.01); *H01L 21/4857* (2013.01); *H05K 1/0298* (2013.01);
(Continued)

(58) Field of Classification Search
CPC .......... H01L 23/49822; H01L 21/4857; H05K 1/0298; H05K 1/115; H05K 1/181;
(Continued)

(56) References Cited

U.S. PATENT DOCUMENTS

2015/0061143 A1* 3/2015 Kim ...................... H01L 23/528
438/618
2016/0174381 A1* 6/2016 Lee ...................... H05K 3/4682
156/247

(Continued)

FOREIGN PATENT DOCUMENTS

JP 6584939 B2 9/2019
JP 6628544 B2 12/2019

OTHER PUBLICATIONS

Kim et al.; English Translation KR20200105031 Published Sep. 7, 2020 (Year: 2020).*

*Primary Examiner* — Steven T Sawyer
(74) *Attorney, Agent, or Firm* — Morgan, Lewis & Bockius LLP

(57) ABSTRACT

A printed circuit board includes a first insulating layer; a first wiring layer buried in the first insulating layer, exposed to one surface of the first insulating layer, and including a plurality of first wiring patterns; a second wiring layer including a plurality of second wiring patterns spaced apart from the plurality of first wiring patterns on the one surface of the first insulating layer; and a second insulating layer disposed on the one surface of the first insulating layer and covering the plurality of second wiring layers. At least a portion of the plurality of second wiring patterns on the one surface of the first insulating layer is disposed in regions between adjacent first wiring patterns among the plurality of first wiring patterns.

21 Claims, 9 Drawing Sheets

(51) Int. Cl.
   *H05K 1/18*    (2006.01)
   *H05K 1/11*    (2006.01)
   *H05K 3/18*    (2006.01)
   *H01L 21/48*   (2006.01)
   *H05K 3/46*    (2006.01)

(52) U.S. Cl.
   CPC ............ *H05K 1/115* (2013.01); *H05K 1/181* (2013.01); *H05K 3/18* (2013.01); *H05K 3/4682* (2013.01); *H05K 2201/1003* (2013.01); *H05K 2201/10015* (2013.01); *H05K 2203/0723* (2013.01)

(58) Field of Classification Search
   CPC ...... H05K 1/02; H05K 1/0256; H05K 1/0296; H05K 1/185
   See application file for complete search history.

(56) References Cited

U.S. PATENT DOCUMENTS

| | | |
|---|---|---|
| 2017/0103944 A1 | 4/2017 | Fukui |
| 2017/0170130 A1 | 6/2017 | Kaneda et al. |
| 2018/0014407 A1* | 1/2018 | Sato .................... H01L 23/3121 |
| 2018/0139842 A1* | 5/2018 | Xu ........................ H05K 3/4652 |

* cited by examiner

PRINTED CIRCUIT BOARD

CROSS-REFERENCE TO RELATED APPLICATION(S)

This application claims benefit of priority to Korean Patent Application No. 10-2020-0177163 filed on Dec. 17, 2020 in the Korean Intellectual Property Office, the disclosure of which is incorporated herein by reference in its entirety.

TECHNICAL FIELD

The present disclosure relates to a printed circuit board.

BACKGROUND

As the semiconductor market for high-end devices has grown with the development of technologies such as 5G communications (5G), an automation function, and artificial intelligence (AI), it has become necessary to design a DIE to which many input/output (I/O) counters are applied. Accordingly, a printed circuit board included in a package has also been designed to implement a microcircuit and to include an increased number of layers of a substrate and an entire substrate with an increased size. To accommodate a plurality of I/Os, it has been necessary to implement a variety of structures of a printed circuit board.

SUMMARY

An aspect of the present disclosure is to provide a printed circuit board including wiring patterns having high density.

Another aspect of the present disclosure is to provide a printed circuit board in which an additional wiring pattern may be designed without increasing the number of layers of a substrate or a size of a substrate.

According to an example embodiment of the present disclosure, a printed circuit board includes a first insulating layer; a first wiring layer buried in the first insulating layer, exposed to one surface of the first insulating layer, and including a plurality of first wiring patterns; a second wiring layer including a plurality of second wiring patterns spaced apart from the plurality of first wiring patterns on the one surface of the first insulating layer; and a second insulating layer disposed on the one surface of the first insulating layer and covering the plurality of second wiring layers. At least a portion of the plurality of second wiring patterns on the one surface of the first insulating layer is disposed in regions between adjacent first wiring patterns among the plurality of first wiring patterns.

According to another example embodiment of the present disclosure, a printed circuit board includes a body including an insulating material; a first wiring layer disposed in the body and including a first wiring pattern and a second wiring pattern; and a second wiring layer disposed on the first wiring layer in the body and including a third wiring pattern disposed to not overlap the first wiring pattern and a fourth wiring pattern disposed to overlap the second wiring pattern.

According to another example embodiment of the present disclosure, a printed circuit board includes an insulating body; and a first wiring layer and a second wiring layer embedded in insulating body. The first wiring layer includes first wiring patterns spaced apart from the second wiring layer, and a second wiring pattern. The second wiring pattern includes third wiring patterns spaced apart from the first wiring layer, and a fourth wiring pattern being in contact with the second wiring pattern.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the attached drawings.

Electronic Device

Figure 1:
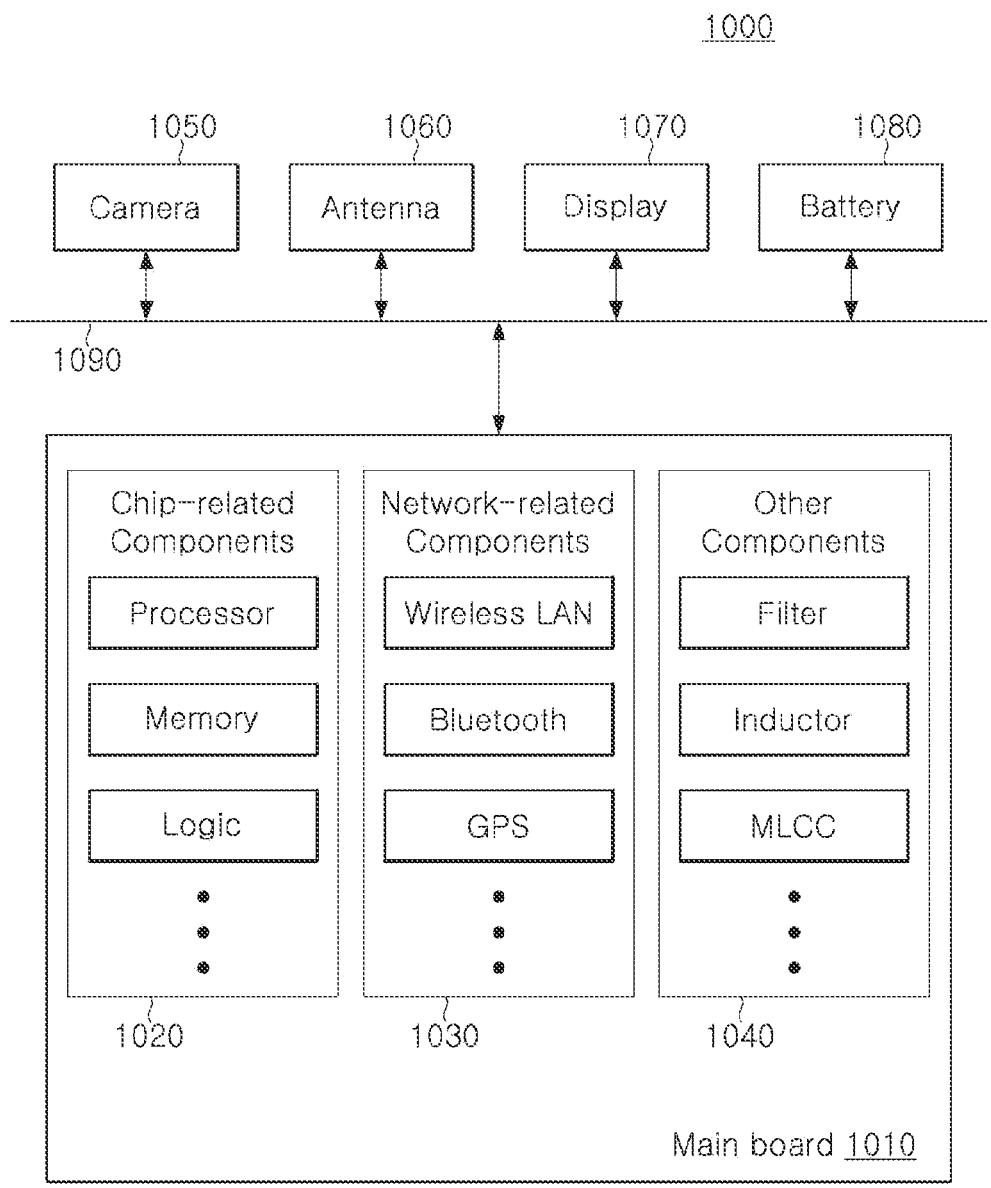
FIG. 1 is a block diagram illustrating an example of an electronic device system.

FIG. 1 is a block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, and may also include other types of chip related components. Also, the chip related components 1020 may be combined with each other. The chip related components 1020 may have a package form including the above-described chip or an electronic component.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, and may also include a variety of other wireless or wired standards or protocols. Also, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include chip-component type passive components used for various other purposes, or the like. Also, other components 1040 may be combined with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, and a battery 1080. However, an example embodiment thereof is not limited thereto, and these other components may include an audio codec, a video codec, a power amplifier, a compass, an accelerometer, a gyroscope, a speaker, amass storage unit (for example, a hard disk drive), a compact disk (CD) drive), a digital versatile disk (DVD) drive, or the like. In addition to the above examples, other components used for various purposes depending on a type of electronic device 1000, or the like, may be included.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
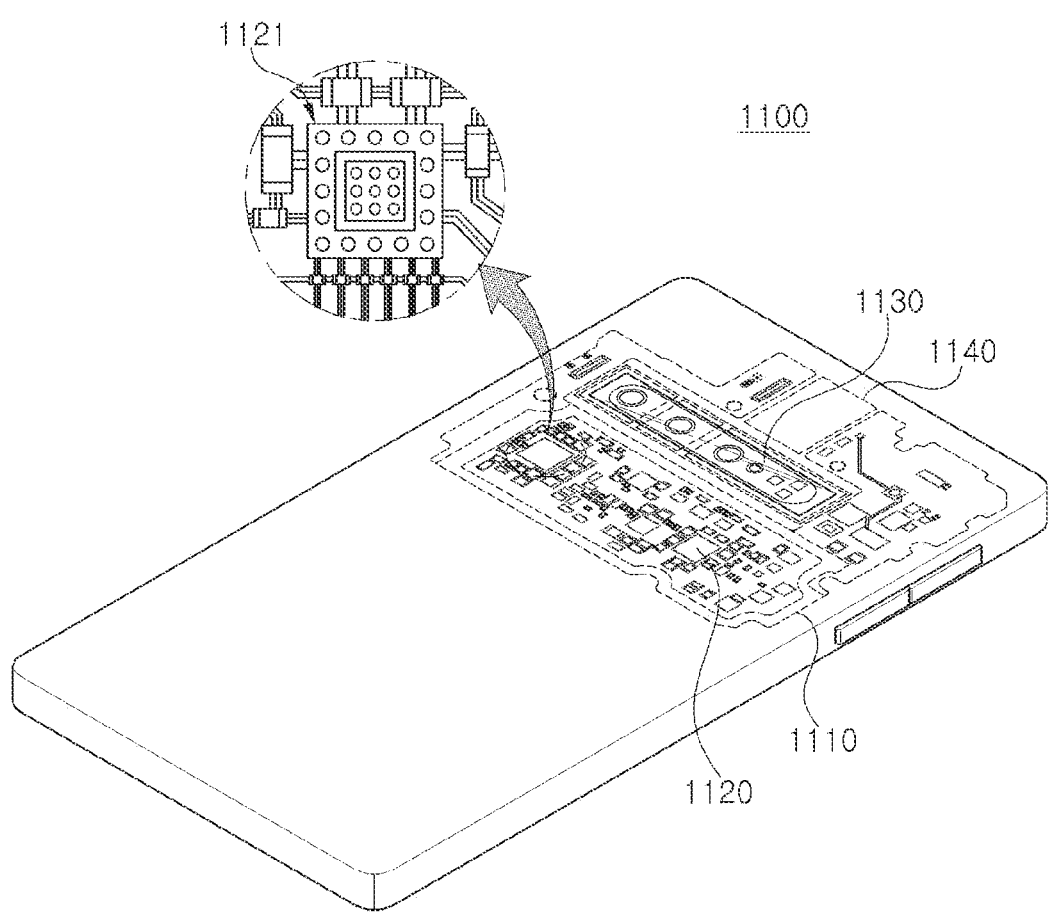
FIG. 2 is a perspective diagram illustrating an example of an electronic device.

FIG. 2 is a perspective diagram illustrating an example of an electronic device.

Referring to FIG. 2, the electronic device may be implemented by a smartphone 1100. A mainboard 1110 may be accommodated in a smartphone 1100, and various electronic components 1120 may be physically or electrically connected to the mainboard 1110. Other electronic components which may or may not be physically or electrically connected to the mainboard 1110, such as the camera module 1130 and/or the speaker 1140, may be accommodated therein. Some of the components 1120 may be the chip related components, such as a component package 1121, for example, but an example embodiment thereof is not limited thereto. In the component package 1121, electronic components may be disposed on a multilayer printed circuit board in the form of surface mounting, but an example embodiment thereof is not limited thereto. The electronic device is not necessarily limited to the smartphone 1100, and may be other electronic devices as described above.

Printed Circuit Board

Figure 3:
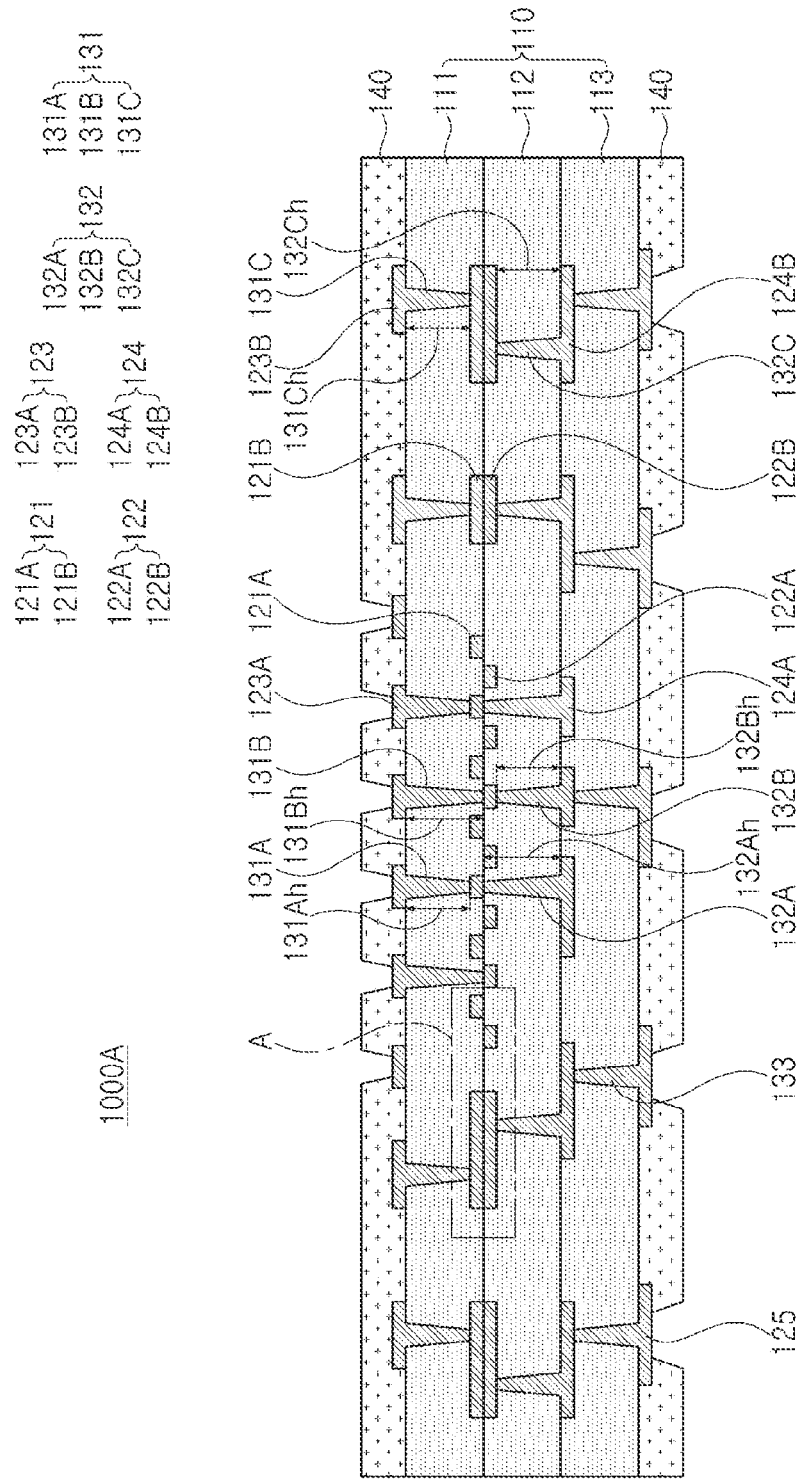
FIG. 3 is a cross-sectional diagram illustrating a printed circuit board according to an example embodiment.

FIG. 3 is a cross-sectional diagram illustrating a printed circuit board according to an example embodiment.

Referring to the diagram, a printed circuit board 1000A may include a plurality of insulating layers 111, 112, and 113, a plurality of wiring layers 121, 122, 123, and 124, and a plurality of via layers 131, 132, and 133. The printed circuit board 1000A may further include a protective layer 140.

Specifically, the printed circuit board 1000A may include a first insulating layer 111, a first wiring layer 121 buried in the first insulating layer 111 and exposed to one surface of the first insulating layer 111, a second wiring layer 122 disposed on one surface of the first insulating layer 111, and a second insulating layer 112 disposed on one surface of the first insulating layer 111 and covering the second wiring layer 122. Also, the printed circuit board 1000A may further include a third wiring layer 123 disposed on the other surface opposite to one surface of the first insulating layer 111 and a fourth wiring layer 124 disposed on the second insulating layer 112. Also, the printed circuit board 1000A may further include a third insulating layer 113 disposed on the second insulating layer 112 and a fifth wiring layer 125 disposed on the third insulating layer 113.

The printed circuit board 1000A may further include at least one of a first via layer 131 penetrating the first insulating layer 111 and connecting the third wiring layer 123 to the first wiring layer 121 and the second wiring layer 122, a second via layer 132 penetrating the second insulating layer 112 and connecting the fourth wiring layer 124 to the first wiring layer 121 and the second wiring layer 122, and a third via layer 133 penetrating the third insulating layer 113 and connecting the fifth wiring layer 125 to the fourth wiring layer 124.

The plurality of insulating layers 111, 112, and 113 may be laminated and may form a body 110 including an insulating material. A portion of the plurality of wiring layers 121, 122, 123, and 124, the wiring layers 121, 122, and 124, may be disposed in the body 110, and the other portion thereof, the wiring layers 123 and 125, may be disposed on the body 110. Also, the plurality of via layers 131, 132, and 133 may be disposed in the body 110 and may connect the plurality of wiring layers 121, 122, 123, and 124 disposed in different levels to each other.

The number of the plurality of insulating layers 111, 112, and 113 is not limited to any particular example, and the number of the insulating layers included in the body 110 may be greater than the number of insulating layers in the example illustrated in the diagram. In this case, an additional insulating layer may be laminated on a surface opposite to the surface of the third insulating layer 113 opposing the second insulating layer 112, but an example embodiment thereof is not limited thereto.

As a material for forming each of the plurality of insulating layers 111, 112, and 113, at least one of an insulating material such as a thermosetting resin such as an epoxy resin, a thermoplastic resin such as a polyimide resin, or resin in which the thermosetting resin or the thermoplastic resin is impregnated in a core material such as a glass fiber (glass cloth or glass fabic) with an inorganic filler, such as prepreg, an Ajinomoto build-up film (ABF), FR-4, bismaleimide triazine (BT), or the like, may be used.

The plurality of insulating layers 111, 112, and 113 may have a boundary therebetween and may be distinguished from one another, or the boundary among the plurality of insulating layers 111, 112, and 113 may be indistinct such that the plurality of insulating layers 111, 112, and 113 may be integrated with one another in a manufacturing process, and it may be difficult to identify the boundary with the naked eye.

The first wiring layer 121 may include a plurality of first wiring patterns 121A, and may further include a second wiring pattern 121B. The second wiring layer 122 may include a plurality of third wiring patterns 122A spaced apart from the plurality of first wiring patterns 121A, and may further include a fourth wiring pattern 122B of which at least a portion overlaps the second wiring pattern 121B. The third wiring layer 122 may include a fifth wiring pattern 123A connected to the first wiring pattern 121A, and may further include a sixth wiring pattern 123B connected to the second wiring pattern 121B. The fourth wiring layer 124 may include a seventh wiring pattern 124A connected to the first wiring pattern 121A, and may further include an eighth wiring pattern 124B connected to the second wiring pattern 121B. The fifth wiring layer 125 may include a wiring pattern connected to the seventh wiring pattern 124A and/or the eighth wiring pattern 124B.

Each of the plurality of first wiring patterns 121A and the plurality of third wiring patterns 122A may not overlap each other so as not to overlap each other. Specifically, at least a portion of the plurality of third wiring patterns 122A on one surface of the first insulating layer 111 may be disposed in regions between adjacent first wiring patterns 121A among the plurality of first wiring patterns 121A, respectively. For example, each of the plurality of third wiring patterns 122A may be disposed in regions between the plurality of first wiring patterns 121A, respectively, on one surface of the first insulating layer 111, such that the plurality of first wiring patterns 121A and the plurality of third wiring patterns 122A may be spaced apart from each other and may be alternately disposed. Similarly, at least a portion of the plurality of first wiring patterns 121A on one surface of the first insulating layer 111 may be disposed in regions between adjacent third wiring patterns 122A among the plurality of third wiring patterns 122A, respectively. Accordingly, the plurality of first wiring patterns 121A and the plurality of third wiring patterns 122A may function as separate wiring layers which may be distinguished from each other.

As described above, the plurality of first wiring patterns 121A may be buried in one surface of the first insulating layer 111, and the plurality of third wiring patterns 122A may be disposed on one surface of the first insulating layer 111 and may be buried in the second insulating layer 112. Accordingly, the first wiring layer 121 and the second wiring layer 122, which are a plurality of wiring layers, may be formed on an interfacial surface between the first insulating layer 111 and the second insulating layer 112. Therefore, as compared to the example in which only one of the first wiring layer 121 and the second wiring layer 122 is included, a greater number of wiring patterns may be integrated and may be efficiently disposed. By including the above-described structure, a printed circuit board including a wiring pattern of high density may be provided, and a printed circuit board in which an additional wiring pattern may be designed without increasing the number of the substrates or a size of the substrate.

A line width of each of the plurality of first wiring patterns 121A and the plurality of third wiring patterns 122A may be narrower than a line width of each of the second wiring pattern 121B and the fourth wiring pattern 122B. A line width of each of the plurality of first wiring patterns 121A may be narrower than a spacing between the plurality of first wiring patterns 121A, and a line width of each of the plurality of third wiring patterns 122A may be narrower than a spacing between the plurality of third wiring patterns 122A. Accordingly, each of the plurality of first wiring patterns 121A and each of the plurality of third wiring patterns 122A may be configured as a fine wiring pattern having a fine pitch.

One surface of the body 110 may include a region in which an electronic component such as a die is disposed, and one surface of the body 110 in which the electronic component is disposed may be the other surface of the first insulating layer 111. In this case, each of the plurality of first wiring patterns 121A and each of the plurality of third wiring patterns 122A may be disposed in a region overlapping a region of one surface of the body 110 in which the electronic component is disposed. Accordingly, the elements may be connected to the electronic component disposed on the printed circuit board 1000A by a short path.

Similarly, the plurality of first wiring patterns 121A and the plurality of third wiring patterns 122A may be disposed further inwardly than the second wiring pattern 121B and the fourth wiring pattern 122B. For example, the plurality of first wiring patterns 121A and the plurality of third wiring patterns 122A may be disposed in a central portion of the body 110, and the second wiring pattern 121B and the fourth wiring pattern 122B may be disposed on an external side of the body 110 to surround the plurality of first wiring patterns 121A and the plurality of third wiring patterns 122A. The plurality of first wiring patterns 121A and the plurality of third wiring patterns 122A may be configured as wiring patterns connected to the I/O terminals of an electronic component such as a die disposed on the printed circuit board 1000A, and thus, the plurality of first wiring patterns 121A and the plurality of third wiring patterns 122A may be disposed on an inner side of the printed circuit board 1000A so as to connect to the electronic component by a short path.

Also, the shortest distance from one surface of the body 110 to each of the plurality of first wiring patterns 121A and each of the plurality of third wiring patterns 122A may be shorter than the shortest distance from the other surface opposite to the one surface of the body to each of plurality of first wiring patterns 121A and each of the plurality of third wiring patterns 122A. For example, as illustrated in the drawing, each of the plurality of first wiring patterns 121A and each of the plurality of third wiring patterns 122A may have the above-described structure by being formed on the other surface of the first insulating layer 111 of the plurality of insulating layers 111, 112, and 113 disposed on an outermost side.

The plurality of first wiring patterns 121A and the plurality of third wiring patterns 122A may have surfaces coplanar with each other. In other words, the plurality of first wiring patterns 121A and the plurality of third wiring patterns 122A may be coplanar with other. In this case, the plurality of first wiring patterns 121A and the plurality of third wiring patterns 122A may also have surfaces coplanar with the first insulating layer 111 and the second insulating layer 112. However, an example embodiment thereof is not limited thereto, and the plurality of first wiring patterns 121A and the plurality of third wiring patterns 122A may not have surfaces coplanar with each other depending on a manufacturing process.

At least portions of the second wiring pattern 121B and the fourth wiring pattern 122B may be disposed to overlap each other. Accordingly, the second wiring pattern 121B and the fourth wiring pattern 122B may function as a single wiring layer differently from each of the plurality of first wiring patterns 121A and the plurality of third wiring patterns 122A.

A sum of thicknesses of the second wiring pattern 121B and the fourth wiring pattern 122B may be greater than a thickness of each of the plurality of first wiring patterns 121A and a thickness of each of the plurality of third wiring patterns 122A. For example, the sum of the thicknesses of the second wiring pattern 121B and the fourth wiring pattern 122B may be substantially the same as the sum of the thicknesses of the plurality of first wiring patterns 121A and the thicknesses of the plurality of third wiring patterns 122A, but an example embodiment thereof is not limited thereto.

The second wiring pattern 121B and the fourth wiring pattern 122B may also have surfaces coplanar with each other. In this case, the second wiring pattern 121B and the fourth wiring pattern 122B may also have surfaces coplanar with the first insulating layer 111 and the second insulating layer 112.

The second wiring pattern 121B may be disposed on a level the same as a level of the first wiring pattern 121A, and the fourth wiring pattern 122B may be disposed on a level the same as a level of the third wiring pattern 122A. Accordingly, the second wiring pattern 121B may be included the first wiring layer 121 together with the first wiring pattern 121A, and the fourth wiring pattern 122B may be included in the second wiring layer 122 together with the third wiring pattern 122A.

Similarly, the sixth wiring pattern 123B may be disposed on a level the same as a level of the fifth wiring pattern 123A, and the eighth wiring pattern 124B may be disposed on a level the same as a level of the seventh wiring pattern 124A. Accordingly, the sixth wiring pattern 123B may be included in the third wiring layer 123 together with the fifth wiring pattern 123A, and the eighth wiring pattern 124B may be included in the fourth wiring layer 124 together with the seventh wiring pattern 124A.

The fifth wiring pattern 123A may be disposed further inwardly than the sixth wiring pattern 123B. For example, the fifth wiring pattern 123A may be disposed in a central portion of the body 110, and the sixth wiring pattern 123B may be disposed on an external side of the body 110 so as to surround the fifth wiring pattern 123A. Also, the seventh wiring pattern 124A may be disposed further inwardly than the eighth wiring pattern 124B. For example, the seventh wiring pattern 124A may be disposed in a central portion of the body 110, and the eighth wiring pattern 124B may be disposed on an external side of the body 110 so as to surround the seventh wiring pattern 124A.

As described above, an electronic component may be disposed on the printed circuit board 1000A, and in this case, the fifth wiring pattern 123A may be connected to the electronic component. For example, the fifth wiring pattern 123A may be directly connected to an I/O terminal of a die through a connection conductor.

As a material for forming each of the plurality of wiring layers 121, 122, 123, and 124, a conductive material such as copper (Cu), aluminum (Al), silver (Ag), tin (Sn), gold (Au), nickel (Ni), lead (Pb), titanium (Ti), or an alloy thereof may be used. A method of forming each of the plurality of wiring layers 121, 122, 123, and 124 is not limited to any particular method, and a first plating layer working as a seed layer may be formed by electroless plating, etc., and a second plating layer may be formed on the first plating layer by electrolytic plating, thereby forming the plurality of wiring layers 121, 122, 123, and 124. In this case, each of the plurality of wiring layers 121, 122, 123, and 124 may include a plurality of metal layers. However, as described later, the second wiring layer 122 may configured as a single metal layer.

The first via layer 131 may penetrate the first insulating layer 111, and may include at least one of a first via 131A connecting the fifth wiring pattern 123A to the first wiring pattern 121A, a second vias 131B connecting the fifth wiring pattern 123A to the second wiring pattern 121B, and a third via 131C connecting the sixth wiring pattern 123B to the first wiring pattern 121A. The second via layer 132 may penetrate the second insulating layer 112, and may include a fourth via 132A connecting the seventh wiring pattern 124A to the first wiring pattern 121A, a fifth via 132B connecting the seventh wiring pattern 124A to the third wiring pattern 122A, and a sixth via 132C connecting the eighth wiring pattern 124B to the fourth wiring pattern 122B. The third via layer 133 may include a via connecting a wiring pattern of the fifth wiring layer 125 to the seventh wiring pattern 124A and/or the eighth wiring pattern 124B of the fourth wiring layer 124.

The first via layer 131 may include vias having different lengths. This structure may be obtained since the distance from the third wiring layer 123 to the first wiring layer 121 is different from the distance from the third wiring layer 123 to the second wiring layer 122. For example, a length 131Ah of the first via 131A may be shorter than a length 131Bh of the second via 131B. Also, a length 131Ch of the third via 131C may be shorter than a length 131Bh of the second via 131B. A length 131Ch of the third via 131C may be the same as a length 131Ah of the first via 131A.

Similarly, the second via layer 132 may also include vias having different lengths. This structure may be obtained since the distance from the fourth wiring layer 124 to the first wiring layer 121 and the distance to the second wiring layer 122 are different from each other. For example, a length 132Ah of the fourth via 132A may be longer than a length 132Bh of the fifth via 132B. Also, a length 132Ch of the sixth via 132C may be shorter than a length 132Ah of the fourth via 132A. A length 132Bh of the fifth via 132B may be the same as a length 133Ch of the sixth via 132C.

Also, a length 131Ah of the first via 131A may be shorter than a length 132Bh of the fourth via 132B. Accordingly, the first via 131A and the fourth via 132B disposed on both sides of the first wiring pattern 121A may have an asymmetrical structure, having different lengths. Similarly, the length 131Bh of the second via 131B may be longer than the length 132Bh of the fifth via 132B. Accordingly, the second via 131B and the fifth via 132B disposed on both sides of the second wiring pattern 122A may have an asymmetrical structure, having different lengths.

The length 131Ch of the third via 131C and the length 132Ch of the sixth via 132C may be the same, but an example embodiment thereof is not limited thereto, and the length 131Ch of the third via 131C and the length 132Ch of the sixth via 132C may be different from each other.

As a material for forming each of the vias included in each of the plurality of via layers 131, 132, and 133, a conductive material such as copper (Cu), aluminum (Al), silver (Ag), tin (Sn), gold (Au), nickel (Ni), lead (Pb), titanium (Ti), or an alloy thereof may be used. The method of forming the via is not limited to any particular method. A via hole may be formed by laser processing, a first plating layer working as a seed layer may be formed along a wall of the via hole by electroless plating, and a second plating layer may be formed on the first plating layer to fill the via hole internally by electrolytic plating.

As illustrated in the drawing, each of the vias included in each of the plurality of via layers 131, 132, and 133 may be integrated with a wiring pattern connected thereto such that the vias may not have a boundary therebetween. However, an example embodiment thereof is not limited thereto, and the vias may be distinguished from each other by having a boundary with a wiring pattern connected thereto depending on a method of forming each of the vias included in each of the plurality of via layers 131, 132, and 133.

Each of the vias included in each of the plurality of via layers 131, 132, and 133 may be a filled-type via completely filled with a conductive material, or a conductive material may be formed along a wall of the via hole. When the via is formed by a conductive material formed along the wall of the via hole, the via hole may be filled with an insulating material. Each of the vias included in each of the plurality of via layers 131, 132, and 133 may have a generally used shape such as a cylindrical shape or a tapered shape.

A protective layer 140 may be disposed on each of the insulating layers 111 and 113 disposed on an outermost side among the plurality of insulating layers 111, 112, and 123, and may have an opening for exposing at least a portion of each of the wiring patterns 123A and 125 included in the wiring layers 123 and 125 disposed on an outermost side among the plurality of wiring layers 121, 122, 123, 124, and 125. Although the sixth wiring pattern 123B is illustrated as being buried in the protective layer 140 in the diagram, the sixth wiring pattern 123B may be exposed through the opening of the protective layer 140.

The protective layer 140 may be configured as a solder resist (SR) layer. However, an example embodiment thereof is not limited thereto, and a generally used insulating material such as Ajinomoto Build-up Film (ABF) may be used as a material for forming the protective layer 140.

Figure 4:
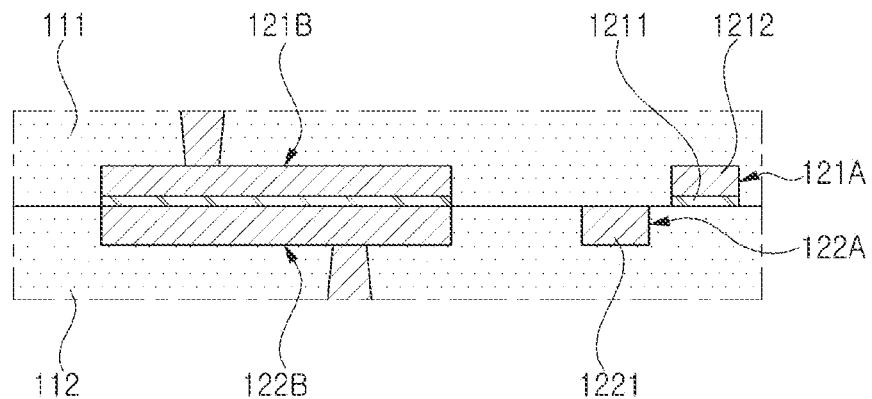
FIG. 4 is a cross-sectional diagram illustrating an example of region "A" of the printed circuit board illustrated in FIG. 3.

FIG. 4 is a cross-sectional diagram illustrating an example of region "A" of the printed circuit board illustrated in FIG. 3.

Referring to the diagram, each of the wiring patterns 121A and 121B included in the first wiring layer 121 may include a first metal layer 1211 and a second metal layer 1212. Also, each of the wiring patterns 122A and 122B included in the second wiring layer 122 may include a third metal layer 1221.

The first metal layer 1211 may be buried in the first insulating layer 111 and may be exposed through one surface of the first insulating layer 111, and the second metal layer 1212 may be disposed on the first metal layer 1211 and may be buried in the first insulating layer 111. The first metal layer 1211 may be configured as a seed layer, and a thickness of the first metal layer 1211 may be lower than a thickness of the second metal layer 1212.

The third metal layer 1221 may be disposed on one surface of the first insulating layer 111 and may be covered by the second insulating layer 112. In this case, the second metal layer 1211 may be exposed to one surface of the second insulating layer 112.

The wiring patterns 121A and 121B included in the first wiring layer 121 may have surfaces coplanar with surfaces of the wiring patterns 122A and 122B included in the second wiring layer 122, respectively, and in this case, the first metal layer 1211 may have surfaces coplanar with surfaces of the wiring patterns 122A and 122B included in the second wiring layer 122, respectively. Also, each of the wiring patterns 122A and 122B included in the first metal layer 1211 and the second wiring layer 122 may have surfaces coplanar with surfaces of the first insulating layer 111 and the second insulating layer 112.

Figure 5:
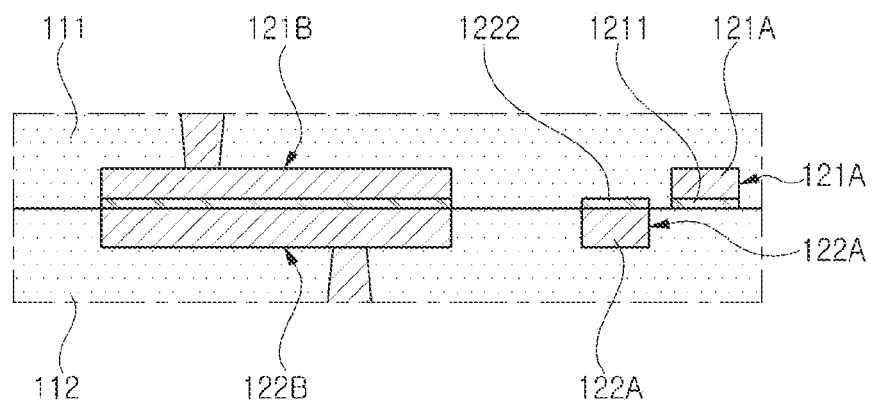
FIG. 5 is a cross-sectional diagram illustrating another example of region "A" of the printed circuit board illustrated in FIG. 3.

FIG. 5 is a cross-sectional diagram illustrating another example of region "A" of the printed circuit board illustrated in FIG. 3.

Referring to the diagram, each of the wiring patterns 121A and 121B included in the first wiring layer 121 may include a first metal layer 1211 and a second metal layer 1212. Also, each of the wiring patterns 122A and 122B included in the second wiring layer 122 may include a third metal layer 1221 and a fourth metal layer 1222. Thus, in FIG. 4, a fourth metal layer 1222 may be further included.

The fourth metal layer 1222 may be buried in the first insulating layer 111 and may be exposed through one surface of the first insulating layer 111. The fourth metal layer 1222 may be configured as a seed layer, and a thickness of the fourth metal layer 1222 may be less than a thickness of the third metal layer 1221. In the process of manufacturing the printed circuit board, the above-described structure may be implemented by not removing the seed layer disposed on the third metal layer 1221 when a seed layer is removed.

The fourth metal layer 1222 may be disposed on a level the same as a level of the first metal layer 1211. Accordingly, the wiring patterns 121A and 121B included in the first wiring layer 121 and the wiring patterns 122A and 122B included in the second wiring layer 122 may partially include regions disposed on the same level by the second metal layer 1212 and the fourth metal layer 1222.

FIGS. 6A to 6M are cross-sectional diagrams illustrating a process of manufacturing the printed circuit board illustrated in FIG. 3.

Figure 6A:
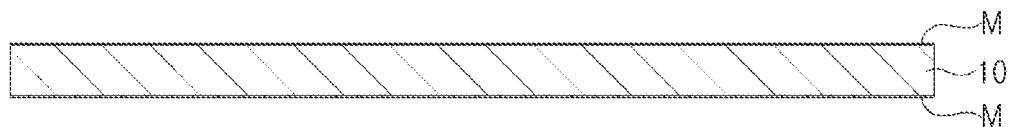
FIGS. 6A to 6M are cross-sectional diagrams illustrating a process of manufacturing the printed circuit board illustrated in FIG. 3.

Referring to FIG. 6A, a base substrate 10 including a metal foil M formed on at least one surface thereof may be prepared. The base substrate 10 may be configured as a copper clad laminate in which a copper foil is laminated on one or both surfaces of an insulating layer, but an example embodiment thereof is not limited thereto.

Figure 6B:
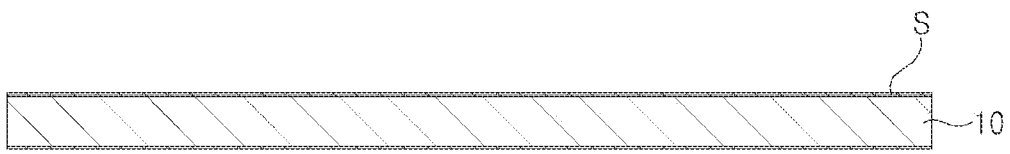

Referring to FIG. 6B, a seed layer S may be formed. The seed layer (S) may be formed by forming a metal layer on the metal foil M by a generally used method such as electroless plating or electrolytic plating.

Figure 6C:
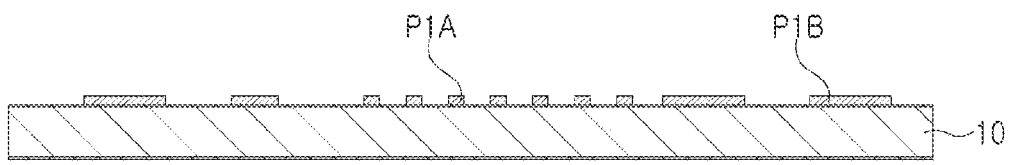

Referring to FIG. 6C, a first wiring pattern P1A and a second wiring pattern P1B may be formed. Although not specifically illustrated in the diagram, each of the first wiring pattern P1A and the second wiring pattern P1B may be formed on the seed layer S through electrolytic plating, and may thus include a seed layer S and may include a plurality of metal layers. The first wiring pattern P1A and the second wiring pattern P1B may correspond to the third wiring pattern 122A and the fourth wiring pattern 122B of the printed circuit board in FIG. 3, respectively.

Figure 6D:
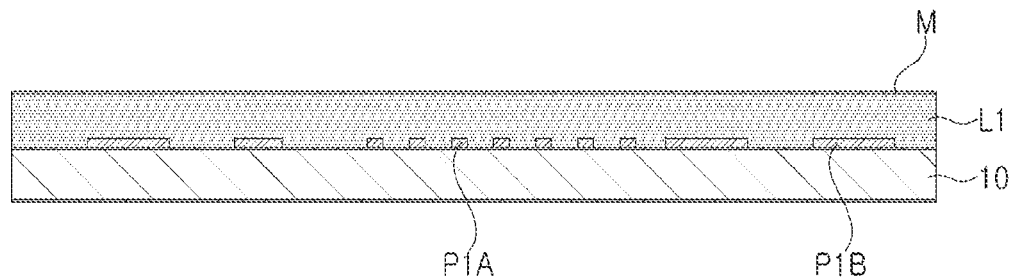

Referring to FIG. 6D, a first insulating layer L1 may be formed to cover the first wiring pattern P1A and the second wiring pattern P1B. The first insulating layer L1 may include a metal foil M laminated on one surface thereof, but an example embodiment thereof is not limited thereto. The first insulating layer L1 may correspond to the second insulating layer 112 of the printed circuit board in FIG. 3.

Figure 6E:
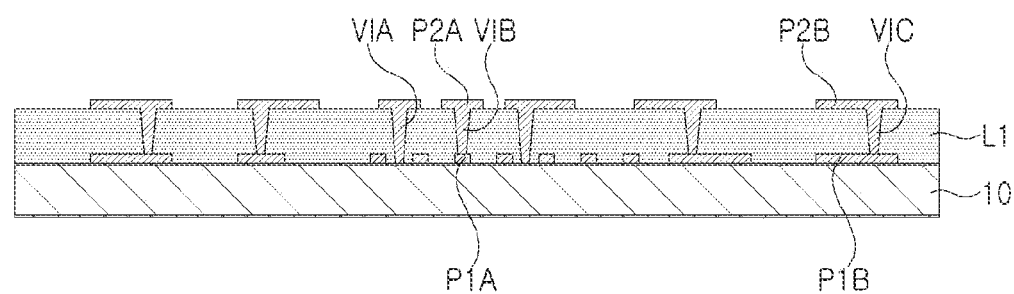

Referring to FIG. 6E, a first via V1A, a second via V1B, a third via V1C, a third wiring pattern P2A, and a fourth wiring pattern P2B may be formed. Although not specifically illustrated in the diagram, each of the first via V1A, the second via V1B, the third via V1C, the third wiring pattern P2A, and the fourth wiring pattern P2B may be formed on the seed layer S by electrolytic plating, and may thus include the seed layer S and may include a plurality of metal layers. The first via V1A, the second via V1B, the third via V1C, the third wiring pattern P2A, and the fourth wiring pattern P2B may correspond to the fourth via 132A, the fifth via 132B, the sixth via 132C, the seventh wiring pattern 124A, and the eighth wiring pattern 124B of the printed circuit board in FIG. 3, respectively.

Figure 6F:
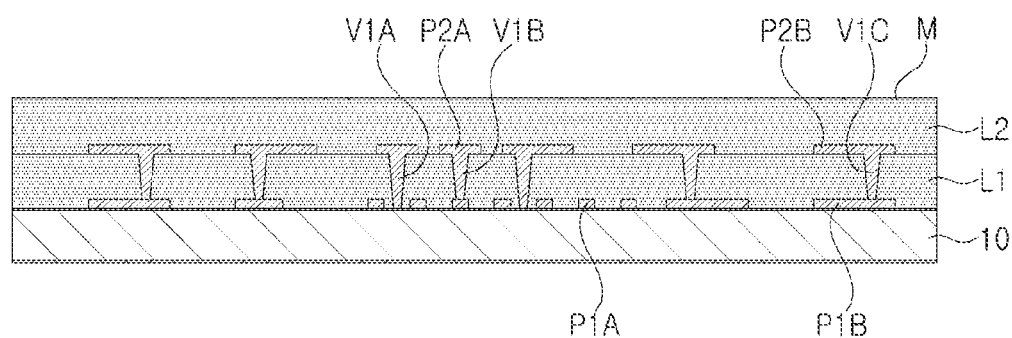

Referring to FIG. 6F, a second insulating layer L2 may be formed to cover the third wiring pattern P2A and the fourth wiring pattern P2B. The second insulating layer L2 may include a metal foil M laminated on one surface thereof, but an example embodiment thereof is not limited thereto. The second insulating layer L2 may correspond to the third insulating layer 113 of the printed circuit board in FIG. 3.

Figure 6G:
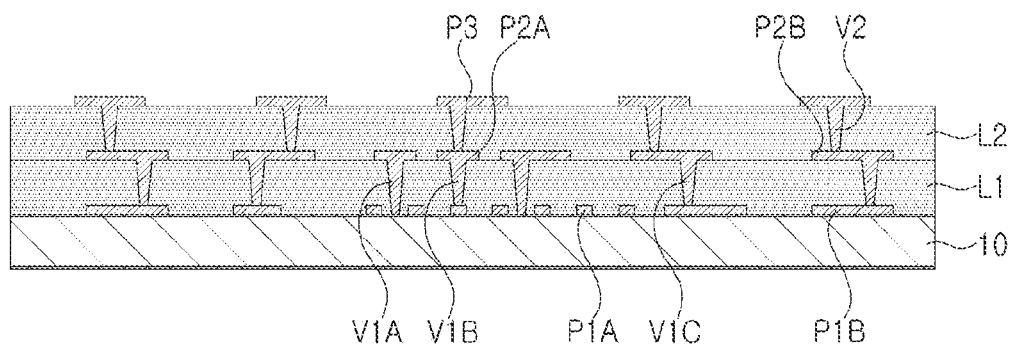

Referring to FIG. 6G, a fourth via V2 and a fifth wiring pattern P3 may be formed. Although not specifically illustrated in the diagram, each of the fourth via V2 and the fifth wiring pattern P3 may be formed on the seed layer S through electrolytic plating, and may thus include the seed layer S and may include a plurality of metal layers. The fourth via V2 and the fifth wiring pattern P3 may correspond to the via included in the third via layer 133 and the wiring pattern included in the fifth wiring layer 125 of the printed circuit board in FIG. 3, respectively.

Figure 6H:
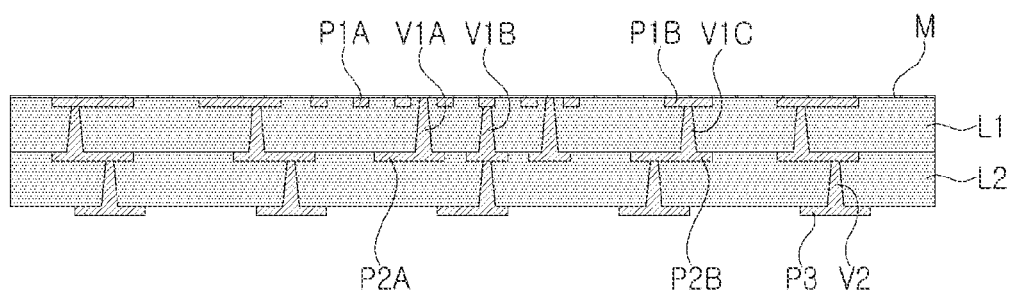

Referring to FIG. 6H, the base substrate 10 may be removed. In this case, the metal foil M formed on one surface of the base substrate 10 may be not removed and may remain, being attached to the first insulating layer L1. The metal foil (M) may function as a seed layer as described later.

Figure 6I:
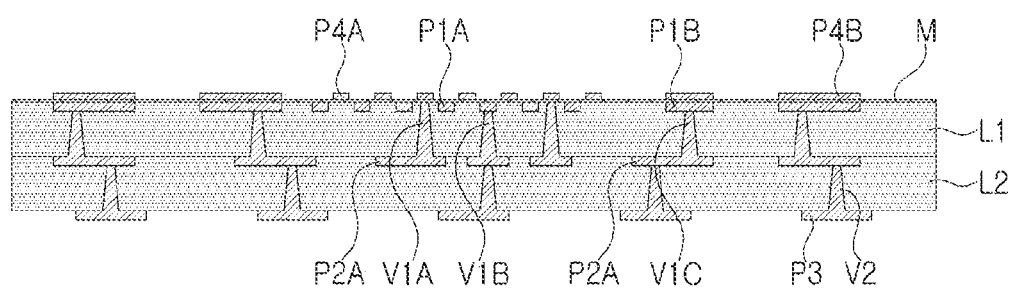

Referring to FIG. 6I, a sixth wiring pattern P4A and a seventh wiring pattern P4B may be formed on the metal foil M. In this case, each of the sixth wiring pattern P4A and the seventh wiring pattern P4B may be formed on the metal foil M working as a seed layer through electrolytic plating.

Figure 6J:
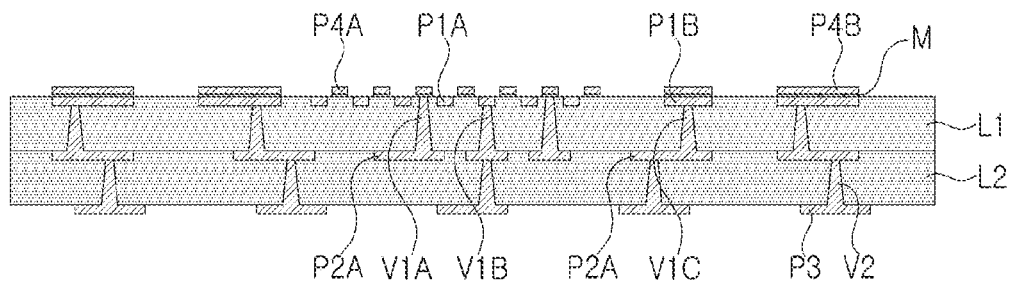

Referring to FIG. 6J, the metal foil M disposed in a region other than the regions corresponding to the sixth wiring pattern P4A and the seventh wiring pattern P4B may be removed. The sixth wiring pattern P4A and the metal foil M, and the seventh wiring pattern P4B and the metal foil M may correspond to the first wiring pattern 112A and the second wiring pattern 112B of the printed circuit board in FIG. 3, respectively.

The metal foil M disposed in the region corresponding to the first wiring pattern P1A and the second wiring pattern P1B may also not be removed. Accordingly, the structure of the wiring pattern illustrated in FIG. 5 may be implemented.

Figure 6K:
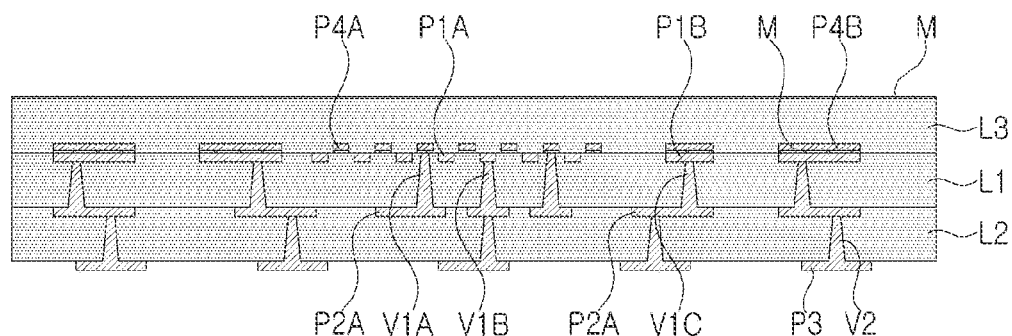

Referring to FIG. 6K, a third insulating layer L3 may be formed to cover the sixth wiring pattern P4A and the seventh wiring pattern P4B. The third insulating layer L3 may include a metal foil M laminated on one surface thereof, but an example embodiment thereof is not limited thereto. The third insulating layer L3 may correspond to the first insulating layer 111 of the printed circuit board in FIG. 3.

Figure 6L:
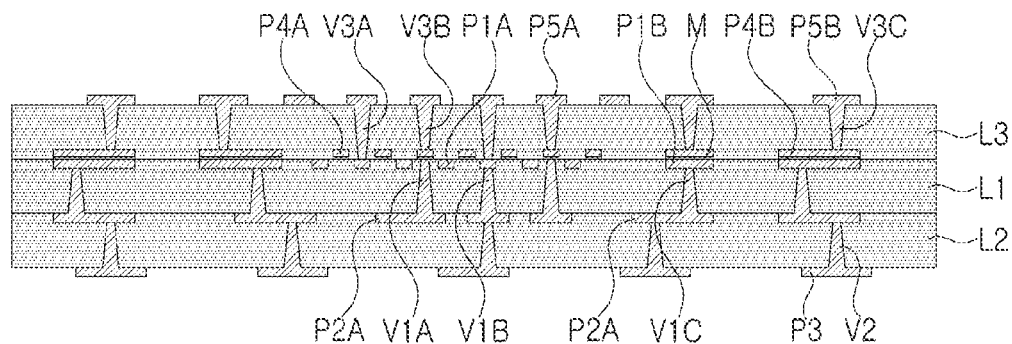

Referring to FIG. 6L, a fifth via V3A, a sixth via V3B, a seventh via V3C, an eighth wiring pattern P5A, and a ninth wiring pattern P5B may be formed. Although not specifically illustrated in the diagram, each of the fifth via V3A, the sixth via V3B, the seventh via V3C, the eighth wiring pattern P5A, and the ninth wiring pattern P5B may be formed on the seed layer S by electrolytic plating, and may thus include the seed layer S and may include a plurality of metal layers. The fifth via V3A, the sixth via V3B, the seventh via V3C, the eighth wiring pattern P5A, and the ninth wiring pattern P5B may correspond to the first via 131A, the second via 131B, the third via 131C, the fifth wiring pattern 123A, and the sixth wiring pattern 123B of the printed circuit board in FIG. 3, respectively.

Figure 6M:
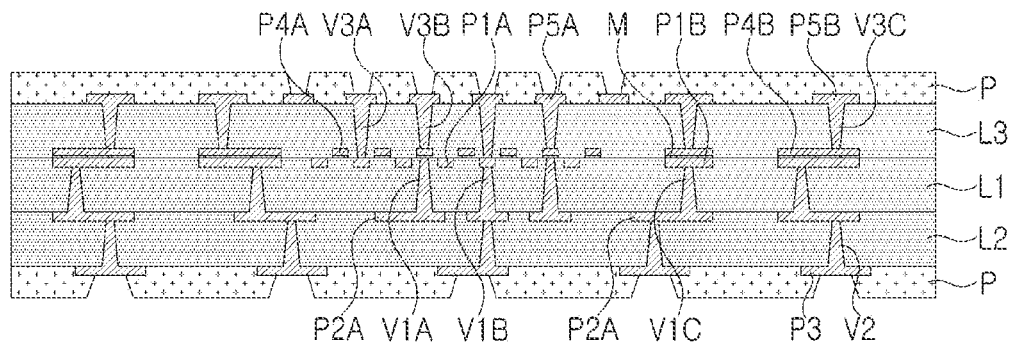

Referring to FIG. 6M, a protective layer P which corresponds to the protective layer 140 in FIG. 3 may be formed.

The above description is provided to describe an example of the process of manufacturing the printed circuit board according to FIG. 3, and the process of manufacturing the printed circuit board in FIG. 3 is not limited thereto.

Figure 7:
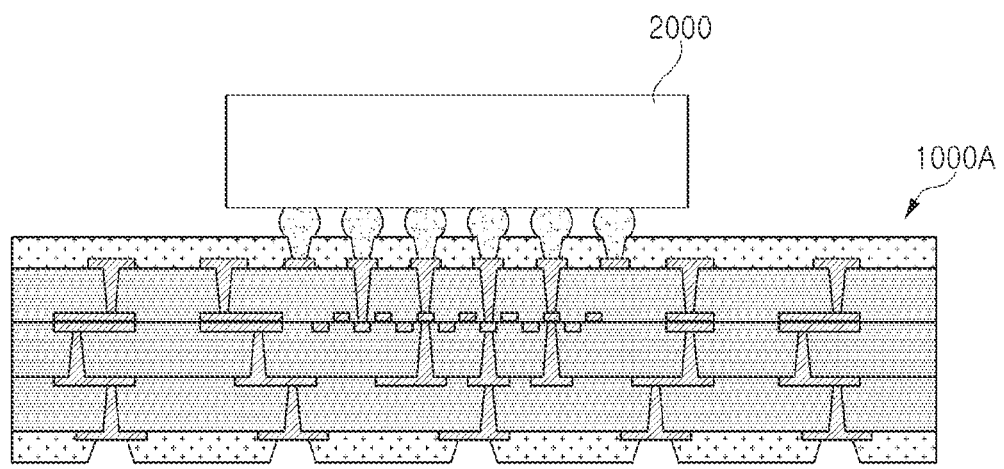
FIG. 7 is a cross-sectional diagram illustrating an example in which an electronic component is mounted on a printed circuit board according to an example embodiment.

FIG. 7 is a cross-sectional diagram illustrating an example in which an electronic component is mounted on a printed circuit board according to an example embodiment.

Referring to the diagram, an electronic component 2000 may be disposed on a printed circuit board 1000A.

The electronic component 2000 may be disposed on the body 110, specifically, on the first insulating layer 111. In this case, the electronic component 2000 may be connected to a plurality of first wiring patterns 121A and a plurality of third wiring patterns 122A of high density, and accordingly, the electronic component 2000 including a plurality of I/O terminals may also be easily connected to the printed circuit board 1000A.

Also, each of the plurality of first wiring patterns 121A and the plurality of third wiring patterns 122A may be disposed on one side of the electronic component 2000 so as to overlap the electronic component 2000 on a plane, and may thus be connected to the electronic component 2000 by a short path.

The electronic component 2000 may be configured as an active component such as a die including an integrated circuit. However, an example embodiment thereof is not limited thereto, and the electronic component 2000 may be configured as a passive component such as a capacitor or an inductor, or may be configured as a package structure including an active component and/or a passive component.

According to the aforementioned example embodiments, a printed circuit board including wiring patterns having high density may be provided.

Also, a printed circuit board in which an additional wiring pattern may be designed without increasing the number of substrates or a size of a substrate may be provided.

In the example embodiment, the expression that an element is "disposed" on another element is not intended to set a direction. Accordingly, the expression that an element is "disposed" on another element may indicate that the element is disposed on an upper side of another element or on a lower side.

In the example embodiments, the term "connected" may not only refer to "directly connected" but also include "indirectly connected" by means of an adhesive layer, or the like. Also, the term "electrically connected" may include both of the case in which elements are "physically connected" and the case in which elements are "not physically connected."

The terms "first," "second," and the like may be used to distinguish one element from the other, and may not limit a sequence and/or an importance, or others, in relation to the elements. In some cases, a first element may be referred to as a second element, and similarly, a second element may be referred to as a first element without departing from the scope of right of the example embodiments.

In the example embodiments, the term "example embodiment" may not refer to one same example embodiment, and may be provided to describe and emphasize different unique features of each example embodiment. The above suggested example embodiments may be implemented do not exclude the possibilities of combination with features of other example embodiments. For example, even though the features described in one example embodiment are not described in the other example embodiment, the description may be understood as relevant to the other example embodiment unless otherwise indicated.

An expression used in the singular encompasses the expression of the plural, unless it has a clearly different meaning in the context.

While the example embodiments have been illustrated and described above, it will be apparent to those skilled in the art that modifications and variations could be made without departing from the scope of the present invention as defined by the appended claims.

What is claimed is:

1. A printed circuit board, comprising:
an uppermost layer and a lowermost layer arranged in a stacking direction;
a first insulating layer disposed between the uppermost layer and the lowermost layer in the stacking direction;
a first wiring layer buried in the first insulating layer, exposed to one surface of the first insulating layer, and including a plurality of first wiring patterns;
a second wiring layer including a plurality of second wiring patterns spaced apart from the plurality of first wiring patterns on the one surface of the first insulating layer; and
a second insulating layer disposed between the uppermost layer and the lowermost layer in the stacking direction and directly on the one surface of the first insulating layer, the second wiring layer being buried in the second insulating layer,
wherein at least a portion of the plurality of second wiring patterns on the one surface of the first insulating layer is disposed in regions between adjacent first wiring patterns among the plurality of first wiring patterns.

2. The printed circuit board of claim 1,
wherein a line width of each of the plurality of first wiring patterns is narrower than a spacing between the plurality of first wiring patterns, and
wherein a line width of each of the plurality of second wiring patterns is narrower than a spacing between the plurality of second wiring patterns.

3. The printed circuit board of claim 1, further comprising:
a third wiring layer disposed on the other surface opposite to the one surface of the first insulating layer and including a third wiring pattern;
a fourth wiring layer disposed on the second insulating layer and including a fourth wiring pattern;
a first via layer penetrating the first insulating layer and including a first via connecting the third wiring pattern to the first wiring pattern; and
a second via layer penetrating the second insulating layer and including a second via connecting the fourth wiring pattern to the first wiring pattern,
wherein a length of the first via is shorter than a length of the second via.

4. The printed circuit board of claim 3,
wherein the first via layer further includes a third via connecting the third wiring pattern to the second wiring pattern,
wherein the second via layer further includes a fourth via connecting the fourth wiring pattern to the second wiring pattern, and
wherein a length of the third via is longer than a length of the fourth via.

5. The printed circuit board of claim 1,
wherein the first wiring layer further includes a third wiring pattern,
wherein the second wiring layer further includes a fourth wiring pattern, and
wherein at least a portion of each of the third wiring pattern and the fourth wiring pattern overlap each other.

6. The printed circuit board of claim 5, wherein a line width of each of the plurality of first wiring patterns and each of the plurality of second wiring patterns is narrower than a line width of each of the third and fourth wiring patterns.

7. The printed circuit board of claim 5, wherein the plurality of first wiring patterns and the plurality of second wiring patterns are disposed further inwardly than the third wiring pattern and the fourth wiring pattern on a plane.

8. The printed circuit board of claim 1, wherein the plurality of first wiring patterns and the plurality of second wiring patterns have surfaces coplanar with each other.

9. The printed circuit board of claim 1,
wherein the first wiring pattern includes a first metal layer and a second metal layer disposed on the first metal layer, and
wherein the second wiring pattern includes a third metal layer.

10. The printed circuit board of claim 9,
wherein the second wiring pattern further includes a fourth metal layer disposed on the third metal layer and buried in the first insulating layer, and
wherein the fourth metal layer is disposed on a level the same as a level of the first metal layer.

11. The printed circuit board of claim 1,
where the plurality of first wiring patterns and the plurality of second wiring patterns are alternately disposed at an interfacial surface between the first insulating layer and the second insulating layer.

12. A printed circuit board, comprising: a body including an insulating material, and an uppermost layer and a lowermost layer arranged in a stacking direction; a first wiring layer disposed in a first layer of the body and including a first wiring pattern and a second wiring pattern; and
a second wiring layer disposed on the first wiring layer in a second layer of the body, directly contacting the first layer, and including a third wiring pattern disposed to not overlap the first wiring pattern and a fourth wiring pattern disposed to overlap the second wiring pattern, wherein the first and second layers of the body are arranged between the uppermost layer and the lowermost layer in the stacking direction.

13. The printed circuit board of claim 12, wherein a sum of a thickness of the second wiring pattern and a thickness of the fourth wiring pattern is greater than each of a thickness of the first wiring pattern and a thickness of the third wiring pattern.

14. The printed circuit board of claim 12, wherein one surface of the body includes a region in which an electronic component is disposed, and wherein the first wiring pattern and the third wiring pattern are disposed in a region overlapping a region of the one surface of the body in which the electronic component is disposed.

15. The printed circuit board of claim 12, wherein the shortest distance from the one surface of the body to each of the first wiring pattern and the third wiring pattern is shorter than the shortest distance from the other surface of the body, opposite to the one surface of the body, to each of the first wiring pattern and the third wiring pattern.

16. A printed circuit board, comprising: an insulating body including an uppermost layer and a lowermost layer arranged in a stacking direction; and a first wiring layer and a second wiring layer embedded in first and second layers of the insulating body, respectively, wherein the second layer directly contacts the first layer, wherein the first wiring layer includes first wiring patterns and a second wiring pattern, the first wiring patterns being spaced apart from the second wiring layer, wherein the second wiring layer includes third wiring patterns spaced apart from the first wiring layer, and a fourth wiring pattern being in contact with the second wiring pattern, and wherein the first and second layers of the insulating body are arranged between the uppermost layer and the lowermost layer in the stacking direction.

17. The printed circuit board of claim 16, wherein the first wiring patterns and the second wiring patterns are alternately disposed.

18. The printed circuit board of claim 16, wherein a line width of the first wiring patterns is narrower than a spacing between the first wiring patterns, and wherein a line width of the second wiring patterns is narrower than a spacing between the second wiring patterns.

19. The printed circuit board of claim 16, further comprising:
   a third wiring layer at least partially embedded in the insulating body;
   a fourth wiring layer embedded in the insulating body;
   a first via connecting the third wiring layer to one of the first wiring patterns; and
   a second via connecting the fourth wiring layer to the one of the first wiring patterns, wherein a length of the first via is shorter than a length of the second via.

20. The printed circuit board of claim 19, further comprising:
   a third via connecting the third wiring layer to the second wiring pattern, a fourth via connecting the fourth wiring layer to the third wiring pattern.

21. The printed circuit board of claim 19, wherein portions of the third wiring layer are exposed to the insulating body.

* * * * *